United States Patent
Kitagawa

(10) Patent No.: US 12,385,981 B2
(45) Date of Patent: Aug. 12, 2025

(54) BATTERY MONITORING DEVICE INCLUDING CALCULATION OF IMPEDANCE USING INDEPENDENT ELECTRICAL PATH TO A RESPONSE SIGNAL INPUT

(71) Applicant: DENSO CORPORATION, Kariya (JP)

(72) Inventor: Masaaki Kitagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 737 days.

(21) Appl. No.: 17/510,851

(22) Filed: Oct. 26, 2021

(65) Prior Publication Data
US 2022/0045544 A1 Feb. 10, 2022

Related U.S. Application Data

(63) Continuation of application No. PCT/JP2020/017386, filed on Apr. 22, 2020.

(30) Foreign Application Priority Data

Apr. 26, 2019 (JP) .................................. 2019-086141

(51) Int. Cl.
G01R 31/389 (2019.01)
G01R 31/36 (2020.01)
(Continued)

(52) U.S. Cl.
CPC ....... G01R 31/389 (2019.01); G01R 31/3648 (2013.01); G01R 31/367 (2019.01);
(Continued)

(58) Field of Classification Search
CPC .............. G01R 31/389; G01R 31/3648; G01R 31/367; G01R 31/382; H01M 10/44;
(Continued)

(56) References Cited

U.S. PATENT DOCUMENTS 5,684,382 A * 11/1997 Fritz .................. H02J 7/00036
320/164
5,721,688 A 2/1998 Bramwell
(Continued)

FOREIGN PATENT DOCUMENTS

JP 2004163284 A * 6/2004
JP 2006-214941 A 8/2006
(Continued)

OTHER PUBLICATIONS

Aug. 4, 2020 International Search Report issued in International Patent Application No. PCT/JP2020/017386.

*Primary Examiner* — Richard Isla
*Assistant Examiner* — Manuel Hernandez
(74) *Attorney, Agent, or Firm* — Oliff PLC

(57) ABSTRACT

In a battery monitoring device for monitoring a state of a rechargeable battery that includes an electrolyte and a plurality of electrodes, a response signal input unit is configured to receive a response signal of the rechargeable battery to a predefined AC signal, and a calculation unit is configured to calculate a complex impedance of the rechargeable battery based on the response signal. A power supply unit is configured to receive a power supply voltage from the rechargeable battery and supplies the power supply voltage to at least the calculation unit. A first electrical path connecting the rechargeable battery to the power supply unit and a second electrical path connecting the rechargeable battery to the signal control unit are provided independent of each other. The signal control unit is configured to cause the rechargeable battery to be monitored, as a power source, to output the predefined AC signal.

11 Claims, 13 Drawing Sheets

(51) Int. Cl.
  *G01R 31/367* (2019.01)
  *G01R 31/382* (2019.01)
  *H01M 10/44* (2006.01)
  *H01M 10/48* (2006.01)
  *H02J 7/00* (2006.01)
  *H02J 7/04* (2006.01)

(52) U.S. Cl.
  CPC .......... *G01R 31/382* (2019.01); *H01M 10/44* (2013.01); *H01M 10/48* (2013.01); *H02J 7/0013* (2013.01); *H02J 7/0014* (2013.01); *H02J 7/0016* (2013.01); *H02J 7/0048* (2020.01); *H02J 7/005* (2020.01); *H02J 7/04* (2013.01)

(58) Field of Classification Search
  CPC ...... H01M 10/48; H02J 7/0013; H02J 7/0014; H02J 7/0016; H02J 7/0048; H02J 7/005; H02J 7/04
  USPC ........ 702/63, 64, 65; 324/430; 320/135, 136
  See application file for complete search history.

(56) References Cited

U.S. PATENT DOCUMENTS

| | | | | |
|---|---|---|---|---|
| 6,002,238 | A | * | 12/1999 | Champlin ............ G01R 31/389 320/DIG. 12 |
| 6,097,193 | A | | 8/2000 | Bramwell |
| 10,855,095 | B2 | * | 12/2020 | Marsili ................ G01R 31/389 |
| 2012/0280693 | A1 | * | 11/2012 | Lammers ............ G01R 31/389 324/430 |
| 2012/0306504 | A1 | | 12/2012 | van Lammeren |
| 2012/0310562 | A1 | * | 12/2012 | van Lammeren .... G01R 31/389 702/63 |
| 2015/0198675 | A1 | * | 7/2015 | Hebiguchi ........... G01R 31/389 324/430 |
| 2016/0195577 | A1 | | 7/2016 | Osaka et al. |
| 2019/0011503 | A1 | | 1/2019 | Nagata |
| 2021/0003638 | A1 | * | 1/2021 | Mizoguchi ............ H02J 7/0047 |
| 2022/0110579 | A1 | * | 4/2022 | Langer ................. A61B 5/4255 |
| 2023/0170906 | A1 | * | 6/2023 | Boolakee ................ G02F 3/00 359/108 |

FOREIGN PATENT DOCUMENTS

| | | |
|---|---|---|
| JP | 2014-102127 A | 6/2014 |
| WO | 97/11361 A1 | 3/1997 |
| WO | 02/35677 A1 | 5/2002 |

* cited by examiner

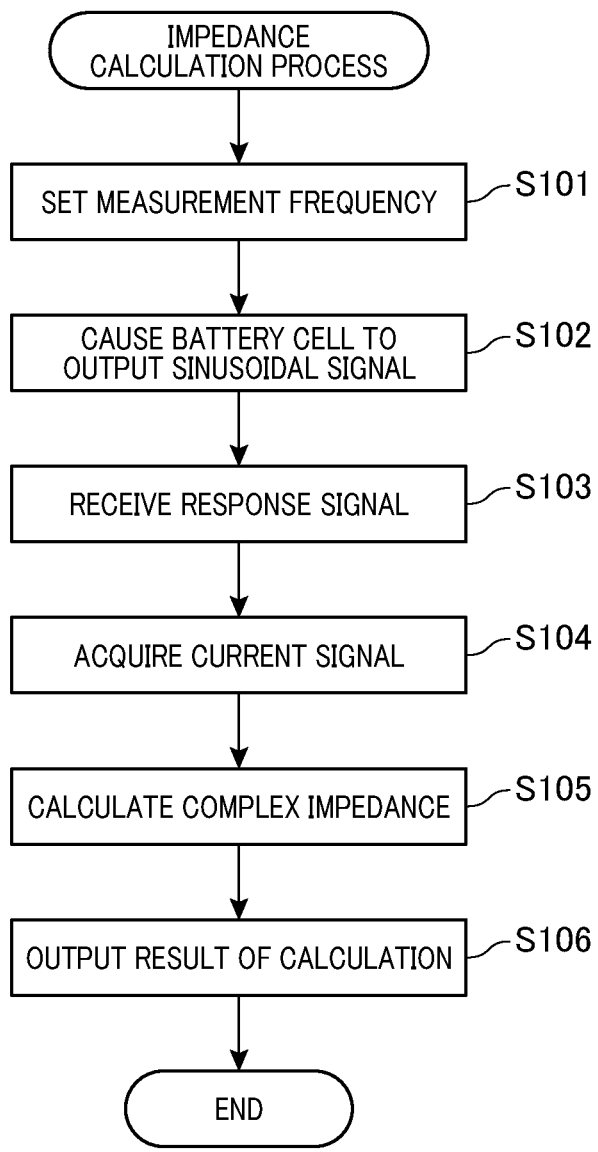

BATTERY MONITORING DEVICE INCLUDING CALCULATION OF IMPEDANCE USING INDEPENDENT ELECTRICAL PATH TO A RESPONSE SIGNAL INPUT

CROSS-REFERENCE TO RELATED APPLICATION

This application is based on and claims the benefit of priority from earlier Japanese Patent Application No. 2019-086141 filed Apr. 26, 2019, the description of which is incorporated herein by reference.

BACKGROUND

Technical Field

The present disclosure relates to a battery monitoring device.

Related Art

Conventionally, the complex impedance of a rechargeable battery is measured in order to monitor the state of the rechargeable battery. In a known technique, a square wave signal is applied to the rechargeable battery by a power controller, and the complex impedance characteristics are calculated based on a response signal thereto. The complex impedance characteristics are then used to determine a deterioration condition of the rechargeable battery.

BRIEF DESCRIPTION OF THE DRAWINGS

In the accompanying drawings:

FIG. 3 is a flowchart of a complex impedance calculation process.

DESCRIPTION OF SPECIFIC EMBODIMENTS

Figure 1:
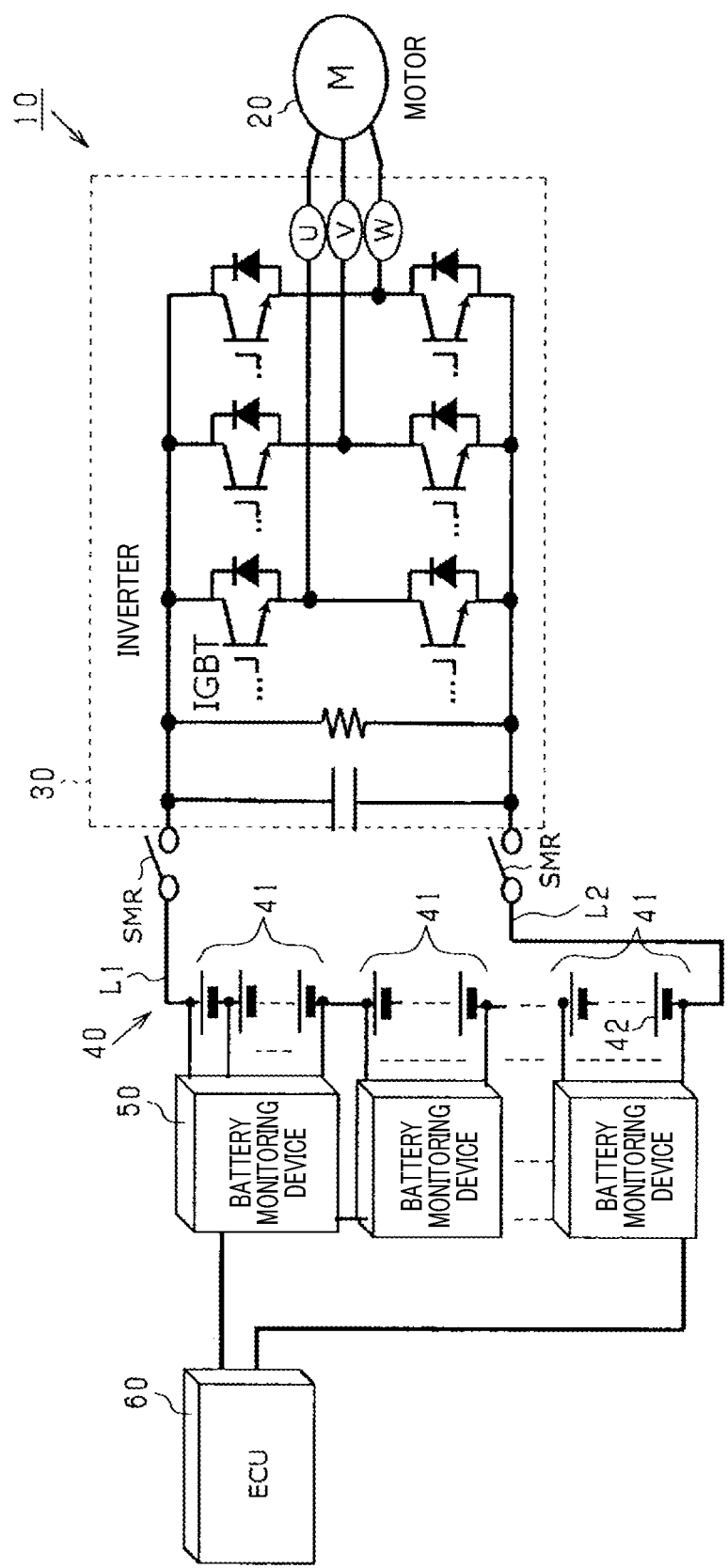
FIG. 1 is a schematic diagram of a power supply system.

According to the above known technique, as disclosed in JP6226261 B2, adoption of the above complex impedance measurement method as a complex impedance measurement method for vehicle rechargeable batteries may give rise to the following issue. That is, a device for applying signals to the rechargeable battery, such as a power controller or the like, is required, which leads to increased size and cost of the battery monitoring device.

In view of the foregoing, it is desired to have a battery monitoring device that can be miniaturized.

One aspect of the present disclosure provides a battery monitoring device for monitoring a state of a rechargeable battery that includes an electrolyte and a plurality of electrodes, including: a signal control unit configured to instruct emission of a predefined AC signal; a response signal input unit configured to receive a response signal of the rechargeable battery to the AC signal; a calculation unit configured to calculate a complex impedance of the rechargeable battery based on the response signal; and a power supply unit configured to receive a power supply voltage from the rechargeable battery and supplies the power supply voltage to at least the calculation unit. In the battery monitoring device, a first electrical path connecting the rechargeable battery to the power supply unit and a second electrical path connecting the rechargeable battery to the signal control unit are provided independent of each other, and the signal control unit is configured to cause the rechargeable battery to be monitored, as a power source, to output the predefined AC signal.

With the above configuration, the signal control unit causes the rechargeable battery to be monitored, as a power source, to output the sinusoidal signal (the predefined alternating current (AC) signal). This eliminates the need for an external power source for inputting the sinusoidal signal to the battery cell, leading to a reduced number of parts, downsizing, and reduced costs.

Typically, the rechargeable battery for a vehicle is connected to peripheral circuits, such as protection elements and filter circuits. Even when an AC signal is input to the rechargeable battery, a portion of the current may leak into these peripheral circuits. Thus, there has been an issue that, when inputting the AC signal to the rechargeable battery and calculating the complex impedance based on the response signal thereto, errors in the response signal may occur due to the effect of the leakage current, leading to reduced accuracy of the complex impedance.

With the above configuration, the rechargeable battery is used as a power source to output the AC signal, which enables implementation of a closed circuit formed of the current modulation circuit and the rechargeable battery. Therefore, the leakage of the current from the rechargeable battery to the peripheral circuits can be eliminated, and the errors in the response signal can be suppressed.

Hereinafter, some embodiments of the disclosure will be described with reference to the accompanying drawings.

First Embodiment

A first embodiment in which a "battery monitoring device" is applied to a power supply system of a vehicle (e.g., a hybrid vehicle or an electric vehicle) will now be described with reference to the accompanying drawings.

As illustrated in FIG. 1, the power supply system 10 includes a motor 20 as a rotary electric machine, an inverter 30 as a power converter that conducts three-phase currents to the motor 20, an assembled battery 40 that can be charged and discharged, a battery monitoring device 50 that monitors the state of the assembled battery 40, and an electronic control unit (ECU) 60 that controls the motor 20 and the like.

The motor 20 is a vehicle prime mover and capable of transmitting power to drive wheels (not shown). In the present embodiment, a three-phase permanent magnet synchronous motor is used as the motor 20.

The inverter 30 is formed of a full bridge circuit having the same number of pairs of upper and lower arms as the number of phases of the phase windings, and the current flowing through each phase winding is adjusted by turning on and off switches (semiconductor switching elements) provided on the corresponding pair of upper and lower arms.

The inverter 30 includes an inverter control unit (not shown). The inverter control unit performs energization control by turning on and off each switch in the inverter 30 based on various items of detection information in the motor 20 and requests for power running and power generation. The inverter control unit thereby supplies electric power from the assembled battery 40 to the motor 20 via the inverter 30 to drive the motor 20 during power running. The inverter control unit causes the motor 20 to generate power based on the power from the drive wheels, converts the generated power and supplies it to the assembled battery 40 via the inverter 30 to charge the assembled battery 40.

The assembled battery 40 is electrically connected to the motor 20 via the inverter 30. The assembled battery 40, with an inter-terminal voltage of, for example, one hundred V or higher, is formed of a plurality of battery modules 41 connected in series. Each battery module 41 is formed of a plurality of battery cells 42 connected in series. For example, a lithium-ion rechargeable battery or a nickel metal hydride rechargeable battery may be used as the battery cells 42. Each battery cell 42 is a rechargeable battery including an electrolyte and a plurality of electrodes.

A positive-side terminal of an electric load such as an inverter 30 or the like is connected to a positive-side power source path L1 that is connected to the positive-side power source terminal of the assembled battery 40. Similarly, the negative-side terminal of the electrical load such as the inverter 30 or the like is connected to the negative-side power source path L2 that is connected to the negative-side power source terminal of the assembled battery 40. The positive-side power source path L1 and the negative-side power source path L2 are each provided with a relay switch referred to as a system main relay switch (SMR). The relay switch SMR is configured to switch between energization and de-energization.

The battery monitoring device 50 is a device that monitors a state of charge (SOC), a state of health (SOH), and the like of each battery cell 42. In the first embodiment, the battery monitoring device 50 is provided for each battery cell 42. The battery monitoring device 50 is connected to the ECU 60, and outputs the state or the like of each battery cell 42. The configuration of the battery monitoring device 50 will be described later.

The ECU 60 requests the inverter control unit for power running and power generation based on various information. The various information includes, for example, information about operations of the accelerator and the brake, the vehicle speed, and the state of the assembled battery 40.

Figure 2:
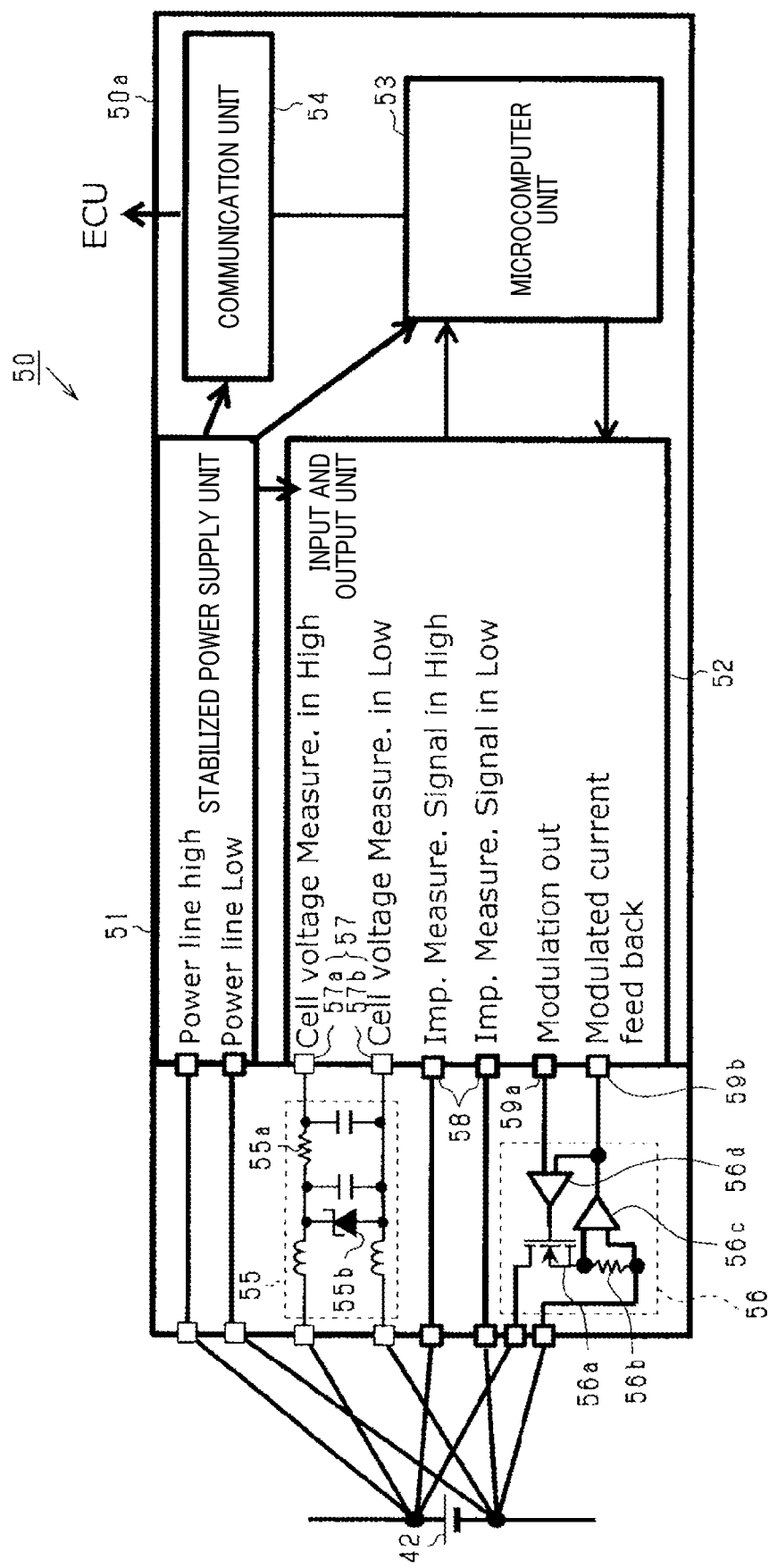
FIG. 2 is a schematic diagram of a battery monitoring device.

The battery monitoring device 50 will now be described in detail. As illustrated in FIG. 2, in the first embodiment, the battery monitoring device 50 is provided for each battery cell 42.

The battery monitoring device 50 includes an application specific integrated circuit (ASIC) unit 50a, a filter unit 55, and a current modulation circuit 56. The ASIC unit 50a includes a regulated power supply unit 51, an input and output unit 52, a microcomputer unit 53 as a calculation unit, and a communication unit 54.

The regulated power supply unit 51 is connected to power lines of the battery cell 42, and supplies electric power supplied from the battery cell 42 to the input and output unit 52, the microcomputer unit 53, and the communication unit 54. The input and output unit 52, the microcomputer unit 53, and the communication unit 54 are driven based on this electric power.

The input and output unit 52 is connected to the battery cell 42 to be monitored. Specifically, the input and output unit 52 includes direct current (DC) voltage input terminals 57 for receiving (measuring) a DC voltage from the battery cell 42. A filter unit 55 is provided between the battery cell 42 and the DC voltage input terminals 57. That is, an RC filter 55a as a filter circuit and a Zener diode 55b as a protection element are provided between the positive-side terminal 57a and the negative-side terminal 57b of the DC voltage input terminals 57. The RC filter 55a, the Zener diode 55b, and the like are connected in parallel to the battery cell 42.

The input and output unit 52 includes response signal input terminals 58 for receiving a response signal (variations in voltage) reflecting the internal complex impedance information of the battery cell 42 between the terminals of the battery cell 42. Therefore, the input and output unit 52 serves as a response signal input unit.

The input and output unit 52 is connected to the current modulation circuit 56 as a signal control unit, and includes an instruction signal output terminal 59a that outputs an instruction signal to the current modulation circuit 56 to instruct emission of a sinusoidal signal (AC signal) from the battery cell 42. The input and output unit 52 further includes a feedback signal input terminal 59b. The feedback signal input terminal 59b receives, as a feedback signal, a current signal actually output (flowing) from the battery cell 42 via the current modulation circuit 56.

The input and output unit 52 is connected to the microcomputer unit 53, and is configured to output the DC voltage received at the DC voltage input terminal 57, the response signal received at the response signal input terminal 58, the feedback signal received at the feedback signal input terminal 59b, and the like, to the microcomputer unit 53. The input and output unit 52, which incorporates an AD converter, is configured to convert received analog signals into digital signals and output the digital signals to the microcomputer unit 53.

The input and output unit 52 is configured to receive the instruction signal from the microcomputer unit 53 and output the instruction signal from the instruction signal output terminal 59a to the current modulation circuit 56. The input and output unit 52, which incorporates a DA converter to convert digital signals received from the microcomputer unit 53 into analog signals, is configured to output the instruction signal (analog signal) to the current modulation circuit 56. The sinusoidal wave instructed by the instruction signal output to the current modulation circuit 56 is DC biased such that the sinusoidal wave signal does not become a negative current (current flowing back into the battery cell 42).

The current modulation circuit 56 is a circuit that causes the battery cell 42 to be monitored, as a power source, to output a predefined AC signal (sinusoidal signal). Specifically, the current modulation circuit 56 includes a semiconductor switching element 56a (e.g., a MOSFET) as a switching unit and a resistor 56b connected in series with the semiconductor switching element 56a. A drain terminal of the semiconductor switching element 56a is connected to the positive terminal of the battery cell 42, and a source terminal of the semiconductor switching element 56a is connected to one end of the resistor 56b. The other end of the resistor 56b is connected to the negative electrode terminal of the battery cell 42. The semiconductor switching element 56a is configured to adjust an amount of current between the drain terminal and the source terminal.

The positive terminal and the negative terminal of the battery cell 42 are respectively connected to the positive electrode and the negative electrode. Preferably, on each of the positive and negative sides of the battery cell 42, it is desirable to connect the response signal input terminal 58 to a connectable point on the terminal of the battery cell 42, closest to the electrode. Preferably, on each of the positive and negative sides of the battery cell 42, it is also desirable to connect the DC voltage input terminal 57 to a connectable point on the terminal of the battery cell 42, closest or next closest to the electrode. This allows the effect of the voltage drop due to the main current or the equalizing current to be minimized.

In the current modulation circuit 56, a current detection amplifier 56c connected to both ends of the resistor 56b is provided as a current detection unit. The current detection amplifier 56c is configured to detect a signal (current signal) flowing through the resistor 56b and output the detected signal as the feedback signal to the feedback signal input terminal 59b of the input and output unit 52.

In the current modulation circuit 56, a feedback circuit 56d is provided. The feedback circuit 56d is configured to receive the instruction signal from the instruction signal output terminal 59a of the input and output unit 52 and receive the feedback signal from the current detection amplifier 56c. The feedback circuit 56d is configured to compare the instruction signal and the feedback signal, and output a result thereof to the gate terminal of the semiconductor switching element 56a.

Based on the signal from the feedback circuit 56d, the semiconductor switching element 56a adjusts the voltage applied between the gate and the source to thereby adjust the amount of current between the drain and the source so as to cause the battery cell 42 to output a sinusoidal signal (a predefined AC signal) instructed by the instruction signal. In cases where there is an error between the waveform instructed by the instruction signal and the waveform actually flowing through the resistor 56b, the semiconductor switching element 56a adjusts the amount of current based on the signal from the feedback circuit 56d to correct for the error. This can stabilize the sinusoidal signal flowing through the resistor 56b.

A method for calculating the complex impedance of the battery cell 42 will now be described. The battery monitoring device 50 performs a complex impedance calculation process illustrated in FIG. 3 in each predefined cycle.

In a complex impedance calculation process, the microcontroller 53 first sets a measurement frequency for the complex impedance (at step S101). The measurement frequency is set to a frequency within a predefined measurement range.

The microcomputer unit 53 determines the frequency of the sinusoidal signal (as a predefined AC signal) based on the measurement frequency, and outputs the instruction signal to the input and output unit 52 to instruct emission of the sinusoidal signal (at step S102).

Upon receipt of the instruction signal, the input and output unit 52 converts the instruction signal into an analog signal using the DA converter and outputs the analog signal to the current modulation circuit 56. The current modulation circuit 56 causes the battery cell 42 as a power source to output a sinusoidal signal based on the instruction signal. Specifically, the semiconductor switching element 56a adjusts the amount of current based on the signal received via the feedback circuit 56d to cause the battery cell 42 to output the sinusoidal signal instructed by the instruction signal. This allows the sinusoidal wave signal to be output from the battery cell 42.

Upon causing the battery cell 42 to output the sinusoidal signal, that is, upon applying a disturbance to the battery cell 42, variations in voltage reflecting the internal complex impedance information of the battery cell 42 is generated between the terminals of the battery cell 42. The input and output unit 52 receives the variations in voltage via the response signal input terminals 58 and outputs, after conversion by AD converter, the variations in voltage to the microcomputer unit 53 as a response signal.

After completion of step S102, the microcontroller unit 53 receives the response signal from the input and output unit 52 (at step S103). The microcontroller unit 53 also acquires the signal flowing through the resistor 56b of the current modulation circuit 56 (that is, the signal output from the battery cell 42) as the current signal (at step S104). Specifically, the microcomputer unit 53 receives the feedback signal (detection signal) output from the current detection amplifier 56c as the current signal via the input and output unit 52. Instead of the feedback signal, a value proportional to the instruction signal instructed to the current modulation circuit 56 may be used as the current signal.

Then, the microcomputer unit 53 calculates the complex impedance based on the response signal and the current signal (at step S105). That is, the microcomputer unit 53 calculates all or some of the real part, the imaginary part, the absolute value, and the phase of the complex impedance based on the amplitude of the response signal, the phase difference of the response signal from the current signal, and the like. The microcomputer unit 53 outputs a result of calculation to the ECU 60 via the communication unit 54 (at step S106). Thereafter, the calculation process ends.

This calculation process is repeatedly performed until complex impedances for a plurality of frequencies within the measurement range are calculated. The ECU 60 may generate a complex impedance plane plot (Cole-Cole plot) based on the results of calculation to acquire characteristics of the electrodes and electrolytes and the like, for example, the state of charge (SOC) and the state of health (SOH).

The entire Cole-Cole plot does not necessarily have to be generated, and a portion thereof may be focused on. For example, the complex impedance for a specific frequency may be measured at certain time intervals during driving to acquire changes in the SOC, the SOH, the battery temperature, and the like during driving based on variations with time in the complex impedance for the specific frequency. Alternatively, the complex impedance for the specific frequency may be measured at time intervals, such as every day, every week, or every year, to acquire variations with time in the SOH and the like based on variations with time in the complex impedance for the specific frequency.

The battery monitoring device 50 of the first embodiment provides the following advantages.

The current modulation circuit 56 causes the battery cell 42 to be monitored, as a power source, to output a sinusoidal signal (a predefined AC signal). This eliminates the need for an external power source for inputting the sinusoidal signal to the battery cell 42, leading to a reduced number of parts, downsizing, and reduced costs.

Typically, the vehicle rechargeable battery is connected to peripheral circuits, such as protection elements and filter circuits. Even when an AC signal is input to the rechargeable battery, a portion of the current may leak into these peripheral circuits. For example, even in the first embodiment, the RC filter 55a and the Zener diode 55b are connected to the battery cell 42. Even when an AC signal is input to the battery cell 42, a portion of the current may leak into these circuits. Thus, there has been an issue that, when calculating the complex impedance based on the response signal to the AC signal input to the battery cell 42, errors in the response signal may occur due to the effect of the leakage current, leading to reduced accuracy of the complex impedance.

In the battery monitoring device 50 of the first embodiment described above, the battery cell 42 is used as a power source to output a sinusoidal signal, which enables implementation of a closed circuit formed of the current modulation circuit 56 and the battery cell 42. Therefore, the leakage of the current from the battery cell 42 can be eliminated, and the errors in the response signal can be suppressed.

There may be errors between the signal actually flowing through the resistor 56b and the sinusoidal signal to be output from the battery cell 42. This may cause errors in the response signal. Therefore, the feedback circuit 56d is provided to provide feedback based on a comparison between the feedback signal (detection signal) and the instruction signal when an instruction is provided to the semiconductor switching element 56a. This allows the instructed sinusoidal signal to be output stably and accurately from the battery cell 42.

When the instruction signal provided to the current modulation circuit 56 instructs the waveform of the sinusoidal signal, the instruction signal is converted from a digital signal to an analog signal. This conversion may cause errors. Providing a filter circuit or the like between the input and output unit 52 and the current modulation circuit 56 can smooth the waveform of the instruction signal to suppress these errors, but providing such a filter circuit may lead to upsizing and increased costs.

In addition, since the vehicle battery cell 42 typically has a large capacity, the measurement range of measurement frequencies used to calculate the complex impedance tends to be wider, which is likely to lead to a larger filter circuit. Therefore, the feedback described above is performed to suppress errors in the waveform of the instruction signal caused by the signal conversion. This allows the filter circuit between the input and output unit 52 and the current modulation circuit 56 to be omitted.

The current modulation circuit 56 is configured to detect a signal flowing through the resistor 56b and output the detected signal as a feedback signal to the microcomputer unit 53 via the input and output unit 52. The microcomputer unit 53 then calculates the complex impedance using the feedback signal as a current signal. With this configuration, even if an error (phase shift or the like) occurs between the signal actually flowing through the resistor 56b and the sinusoidal signal (the signal instructed by the microcomputer unit 53) to be output, use of the feedback signal, that is, the signal actually flowing through the resistor 56b, can improve the calculation accuracy of the complex impedance.

The correction is made using the feedback signal as described above, which allows a filter circuit to be omitted between the input and output unit 52 and the current modulation circuit 56, and thus allows the battery monitoring device 50 to be downsized.

Figure 4A:
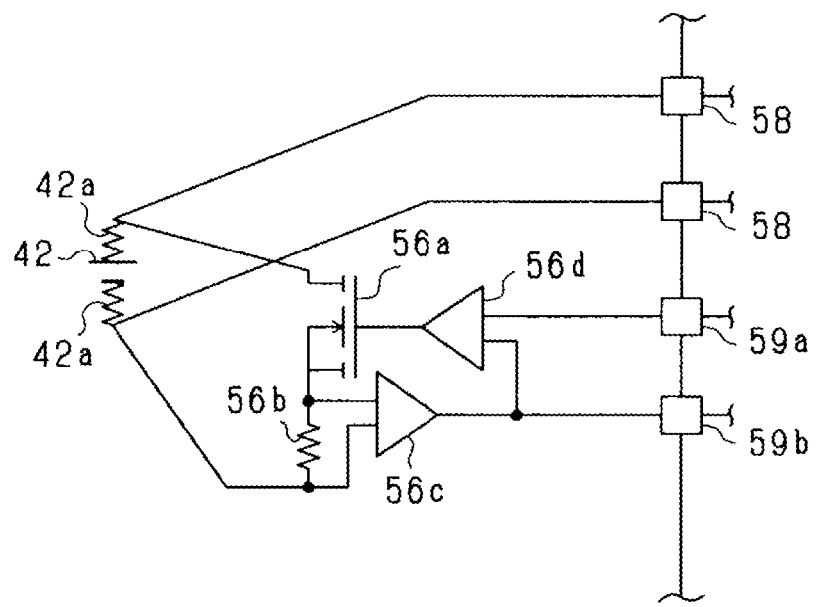
FIG. 4A is an illustration of connection points.
Figure 4B:
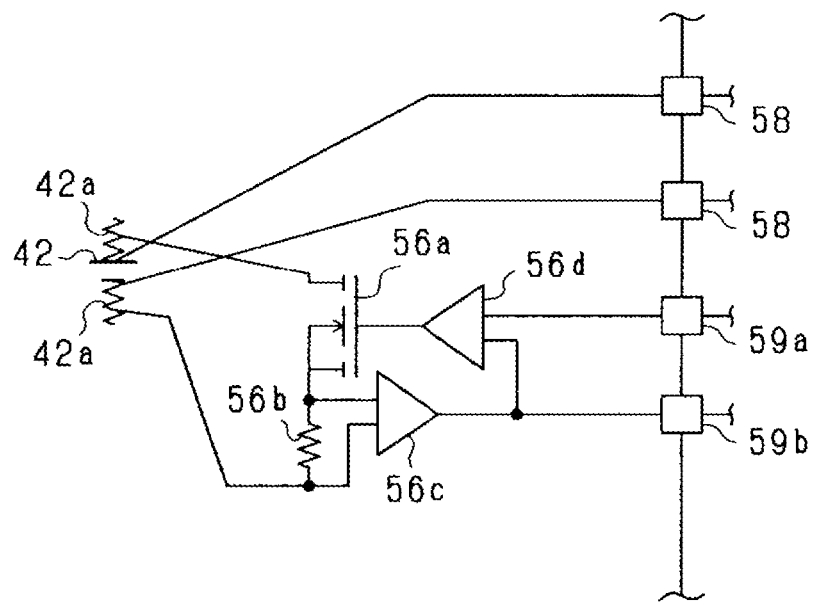
FIG. 4B is an illustration of connection points.

The response signal input terminals 58 are connected to connectable points on the terminals of the battery cell 42, closest to the respective electrodes of the battery cell 42. This allows the effect of the impedance component of the terminals of the battery cell 42 to be suppressed, thereby further improving the calculation accuracy of the complex impedance. More specifically, as illustrated in FIGS. 4A and 4B, each terminal 42a of the battery cell 42 has an impedance component. Hence, on each of the positive and negative sides of the battery cell 42, it is desirable to connect the response signal input terminal 58 to a connection point on the terminal 42a, closer to the electrode, as illustrated in FIG. 4B rather than in FIG. 4A. This can further improve the calculation accuracy of the complex impedance. As illustrated in FIG. 4B, on each of the positive and negative sides of the battery cell 42, the connection point on the terminal of the battery cell 42, to which the response signal input terminal 58 is connected, is closer to the electrode than the connection point to which the current modulation circuit 56 is connected.

Second Embodiment

The battery monitoring device 50 according to a second embodiment will now be described. The battery monitoring device 50 of the second embodiment implements so-called dual phase lock-in detection described in detail later. In the following, the components of the battery monitoring device 50 that are the same as or similar to those of the above embodiment are assigned the same reference numerals, and descriptions about these components will be omitted.

Figure 5:
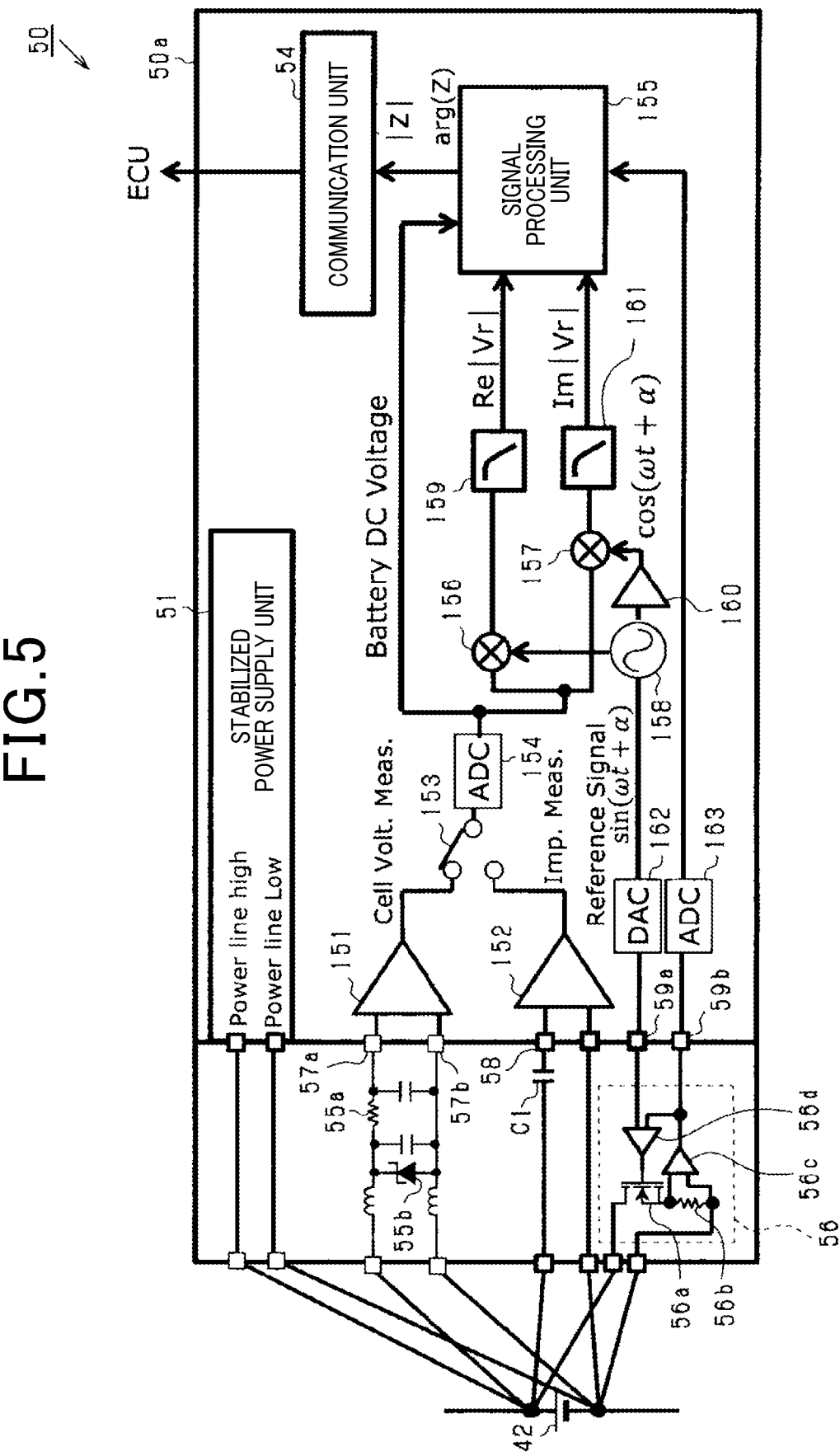
FIG. 5 is a schematic diagram of a battery monitoring device according to a second embodiment.

As illustrated in FIG. 5, the ASIC unit 50a of the battery monitoring device 50 includes a differential amplifier 151 that measures the DC voltage between the terminals of the battery cells 42. The differential amplifier 151 is connected between the DC voltage input terminals 57, and is configured to measure and output the DC voltage.

In the ASIC unit 50a of the battery monitoring device 50, a pre-amplifier 152 as an amplifier is provided to receive, via the response signal input terminals 58, variations in the voltage of the battery cell 42 during the sinusoidal signal being output. The pre-amplifier 152 amplifies the variations in the voltage of the battery cell 42 received via the response signal input terminals 58 and outputs the amplified variations as a response signal. That is, since the amplitude of the response signal is a weak signal as compared to the voltage of the battery cell 42, the pre-amplifier 152 is provided to improve the detection accuracy of the response signal. In the second embodiment, the pre-amplifier 152 is configured as having one stage, but it may be configured as having multiple stages.

As illustrated in FIG. 5, a capacitor C1 is provided between the positive terminal of the battery cell 42 and the positive response signal input terminal 58 (the positive terminal side of the pre-amplifier 152) to cut off the DC component. This enables removal of the DC component (not related to the internal complex impedance information) from the variations in the voltage of the battery cell 42, thereby improving the detection accuracy of the response signal.

In the ASIC unit 50a, a signal switcher 153 is provided to switch between the DC voltage output from the differential amplifier 151 and the response signal output from the pre-amplifier 152. An AD converter 154 is connected to the signal switcher 153, and is configured such that the switched signal (analog signal) is converted into a digital signal and output.

The AD converter 154 is connected to the signal processing unit 155 as a calculation unit in the second embodiment, and is configured to input the DC voltage to the signal processing unit 155. The AD converter 154 is also connected to a first multiplier 156 and a second multiplier 157, and is configured to input the response signal to the first multiplier 156 and the second multiplier 157.

An oscillation circuit 158, which is described later, is connected to the first multiplier 156, and is configured to input a first reference signal to the first multiplier 156. The first multiplier 156 multiplies the first reference signal and the response signal, calculates a value proportional to the real part of the response signal, and outputs the value proportional to the real part of the response signal to the signal processing unit 155 via a low-pass filter 159. In FIG. 5, the real part of the response signal is denoted by Re|Vr|.

The second multiplier 157 is connected to the oscillation circuit 158 through a phase shift circuit 160, and is configured to receive a second reference signal. The second reference signal is the first reference signal advanced in phase by 90 degrees (n/2). The phase shift circuit 160 advances the phase of the sinusoidal signal (the first reference signal) received from the oscillation circuit 158 and outputs it as the second reference signal.

The second multiplier 157 multiplies the second reference signal and the response signal to calculate a value proportional to the imaginary part of the response signal, and outputs the value proportional to the imaginary part of the response signal to the signal processing unit 155 via a low-pass filter 161. In FIG. 5, the imaginary part of the response signal is denoted by Im|Vr|.

The oscillation circuit 158 is a circuit that outputs the sinusoidal signal set therein and serves as a waveform instruction unit. As described above, the oscillation circuit 158 outputs the sinusoidal wave signal as the first reference signal to the first multiplier 156 and the phase shift circuit 160. The oscillation circuit 158 is connected to the instruction signal output terminal 59a via the DA converter 162, and outputs the sinusoidal wave signal as the instruction signal.

The feedback signal input terminal 59b is connected to the signal processing unit 155 via the AD converter 163. The signal processing unit 155 receives the feedback signal (detection signal) from the feedback signal input terminal 59b via the AD converter 163.

The signal processing unit 155 receives the value proportional to the real part of the response signal and the value proportional to the imaginary part of the response signal, and calculates the real part and the imaginary part of the complex impedance based on those values. To this end, the signal processing unit 155 calculates (corrects) the real and imaginary parts of the complex impedance using the received feedback signal and taking into account the amplitude and the phase shift from the reference signal, of the signal actually flowing.

The signal processing unit 155 calculates the absolute value and the phase of the complex impedance. More specifically, since the real and imaginary parts of the response signal are acquired by the dual phase lock-in detection, the response signal can be expressed as $|Vr|e^{j\theta v}$ in the polar coordinate representation of the complex plane, where θv is the phase of the response signal and "j" is the imaginary unit that satisfies j^2=−1. Similarly, the current can be expressed as $|I|e^{j\theta i}$. In the polar coordinate representation, the complex impedance $|Z|e^{j\theta z}$ can be expressed as equation (1) derived from V=ZI.

$$|Z|e^{j\theta_z} = \frac{|Vr|e^{j\theta_v}}{|I|e^{j\theta_i}} \quad (1)$$

Therefore, the absolute value of the complex impedance can be acquired from |Z|=|Vr|/|I|, and the phase can be acquired from θv−θi. Then, the signal processing unit 155 outputs this calculation result to the ECU 60 via the communication unit 54. In FIG. 5, the absolute value of the complex impedance is denoted by |Z|, and its phase is denoted by arg(Z).

Figure 6:
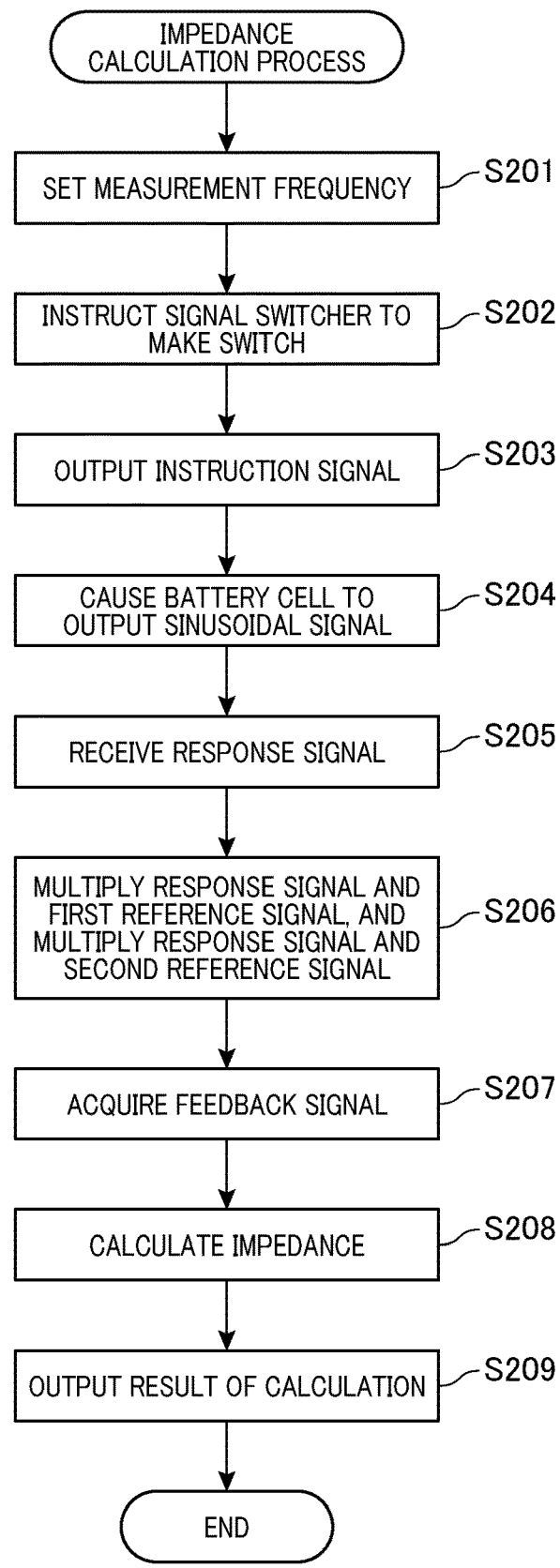
FIG. 6 is a flowchart of a complex impedance calculation process of the second embodiment.

A complex impedance calculation process in the second embodiment will now be described with reference to FIG. 6. The complex impedance calculation process is performed every predefined cycle by the battery monitoring device 50.

In the complex impedance calculation process, the oscillation circuit 158 first sets a measurement frequency for the complex impedance (at step S201). The measurement frequency is set to a frequency within a predefined measurement range. In the second embodiment, the measurement frequency is determined, for example, by the signal processing unit 155.

The signal switcher 153 makes a switch such that the response signal from the pre-amplifier 152 is output (at step S202). The switching is instructed, for example, by the signal processing unit 155.

The oscillation circuit 158 determines a frequency of the sinusoidal signal (predefined AC signal) based on the measurement frequency, and outputs an instruction signal that instructs to the current modulation circuit 56 emission of the sinusoidal signal, from the instruction signal output terminal 59a via the DA converter 162 (at step S203). The instruction for outputting the instruction signal is provided, for example, by the signal processing section 155. In conversion into an analog signal by the DA converter 162, an appropriate offset value (DC bias) is set taking into account the voltage of the battery cell 42. The offset value (DC bias) is set, for example, by the signal processing unit 155. It is desirable that the offset value (DC bias) is set based on the DC voltage of the battery cell 42. The DC voltage of the battery cell 42 may be measured by the differential amplifier 151.

The current modulation circuit 56 causes the battery cell 42 as a power source to output a sinusoidal signal based on the instruction signal (at step S204). Thus, the sinusoidal wave signal is output from the battery cell 42.

Upon causing the battery cell 42 to output the sinusoidal signal, variations in the voltage reflecting the internal complex impedance information of the battery cell 42 occur between the terminals of the battery cell 42. The pre-amplifier 152 receives the variations in the voltage of the of the battery cell 42 via the response signal input terminal 58 and outputs the variations in the voltage of the battery cell 42 as a response signal (at step S205).

When the variations in voltage are input to the response signal input terminals 58, the DC component of the variations in voltage is cut off by the capacitor C1, and only characteristic portions of the variations in voltage are extracted. The pre-amplifier 152 amplifies the weak variations in voltage with the DC component cut off and outputs them as a response signal. Then, the AD converter 154 converts the response signal received via the signal switcher 153 into a digital signal and outputs it. Preferably, the magnitude of the DC component cut off by the capacitor C1 is adjusted based on the DC voltage of the battery cell 42. Also preferably, to what degree the variations in voltage are amplified is adjusted based on the DC voltage of the battery cell 42.

The first multiplier 156 uses the sinusoidal signal received from the oscillation circuit 158 as the first reference signal and multiplies the first reference signal and the response signal received from the AD converter 154 to calculate a value proportional to the real part of the response signal (at step S206). Similarly, the second multiplier 157 multiplies the second reference signal received from the phase shift circuit 160 and the response signal to calculate a value proportional to the imaginary part of the response signal.

These values are input to the signal processing unit 155 through the low-pass filter 159 and the low-pass filter 161. Signals other than DC components are attenuated and removed during passing through the low-pass filter 159 and the low-pass filter 161.

The signal processing unit 155 receives a feedback signal (detection signal) from the feedback signal input terminal 59b (at step S207). When the feedback signal is input to the signal processing unit 155, it is converted into a digital signal by the AD converter 163.

The signal processing unit 155 calculates all or some of the real part, the imaginary part, the absolute value, and the phase of the complex impedance based on the feedback signal and the signals (values proportional to the real part and the imaginary part of the response signal) received from the low-pass filters 159 and 161 (at step S208). The feedback signal is used to correct for any deviation in amplitude or phase between the current actually flowing from the battery cell 42 (i.e., the feedback signal) and the value proportional to the reference signal.

Thereafter, the signal processing unit 155 outputs the result of calculation to the ECU 60 via the communication unit 54 (at step S209). Then, the complex impedance calculation process ends.

This calculation process is repeatedly performed until complex impedances for a plurality of frequencies within the measurement range are calculated. The ECU 60 may generate a complex impedance plane plot (Cole-Cole plot) based on the results of calculation to acquire characteristics of the electrodes and electrolytes and the like, for example, the state of charge (SOC) and the state of health (SOH).

The entire Cole-Cole plot does not necessarily have to be generated, and a portion thereof may be focused on. For example, the complex impedance for a specific frequency may be measured at certain time intervals during driving to acquire changes in the SOC, the SOH, the battery temperature, and the like during driving based on variations with time in the complex impedance for the specific frequency. Alternatively, the complex impedance for the specific frequency may be measured at time intervals, such as every day, every month, or every year, to acquire variations with time in the SOH and the like based on variations with time in the complex impedance for the specific frequency.

The battery monitoring device 50 of the second embodiment provides the following advantages.

The signal processing unit 155 calculates the value proportional to the real part of the response signal based on the value acquired by multiplying the response signal received from the response signal input terminal 58 and the first reference signal. In addition, the signal processing unit 155 calculates the value proportional to the imaginary part of the response signal based on the value acquired by multiplying the response signal and the second reference signal, where the second reference signal is the first reference signal shifted in phase. Then, the complex impedance is calculated based on these values. In this way, performing so-called lock-in detection allows only the frequency component of the same frequency as the frequency of the sinusoidal signal instructed by the oscillation circuit 158 to be extracted from the response signal. This leads to increased resistance to white noise and pink noise. Therefore, the complex impedance can be calculated with high accuracy. In particular, even in a noisy environment, such as in a vehicle, the complex impedance can be suitably calculated. In addition, such increased resistance to noise allows the current (sinusoidal signal) output from the battery cell 42 to be decreased. Therefore, power consumption and temperature rise of the battery cell 42 and the semiconductor switching element 56a can be suppressed.

The signal processing unit 155 receives from the current modulation circuit 56 the feedback signal (detection signal) that is a current signal actually flowing from the battery cell 42, and using the feedback signal, corrects for the deviations in amplitude and phase from the value proportional to the reference signal. This can improve the accuracy of the calculation of the complex impedance.

In addition, even if errors occur during conversion of the instruction signal into an analog signal, correcting for the deviations in amplitude and phase using the feedback signal enables suppression of such errors. Therefore, there is no need for providing a filter circuit or the like between the current modulation circuit 56 and the DA converter 162, which enables downsizing.

Third Embodiment

The battery monitoring device 50 according to a third embodiment will now be described. The battery monitoring device 50 of the third embodiment performs a fast Fourier transform (FFT) in signal analysis, which will be described in detail later. In the following, the components of the battery monitoring device 50 that are the same as or similar to those of each of the above embodiments are assigned the same reference numerals, and descriptions about these components will be omitted.

Figure 7:
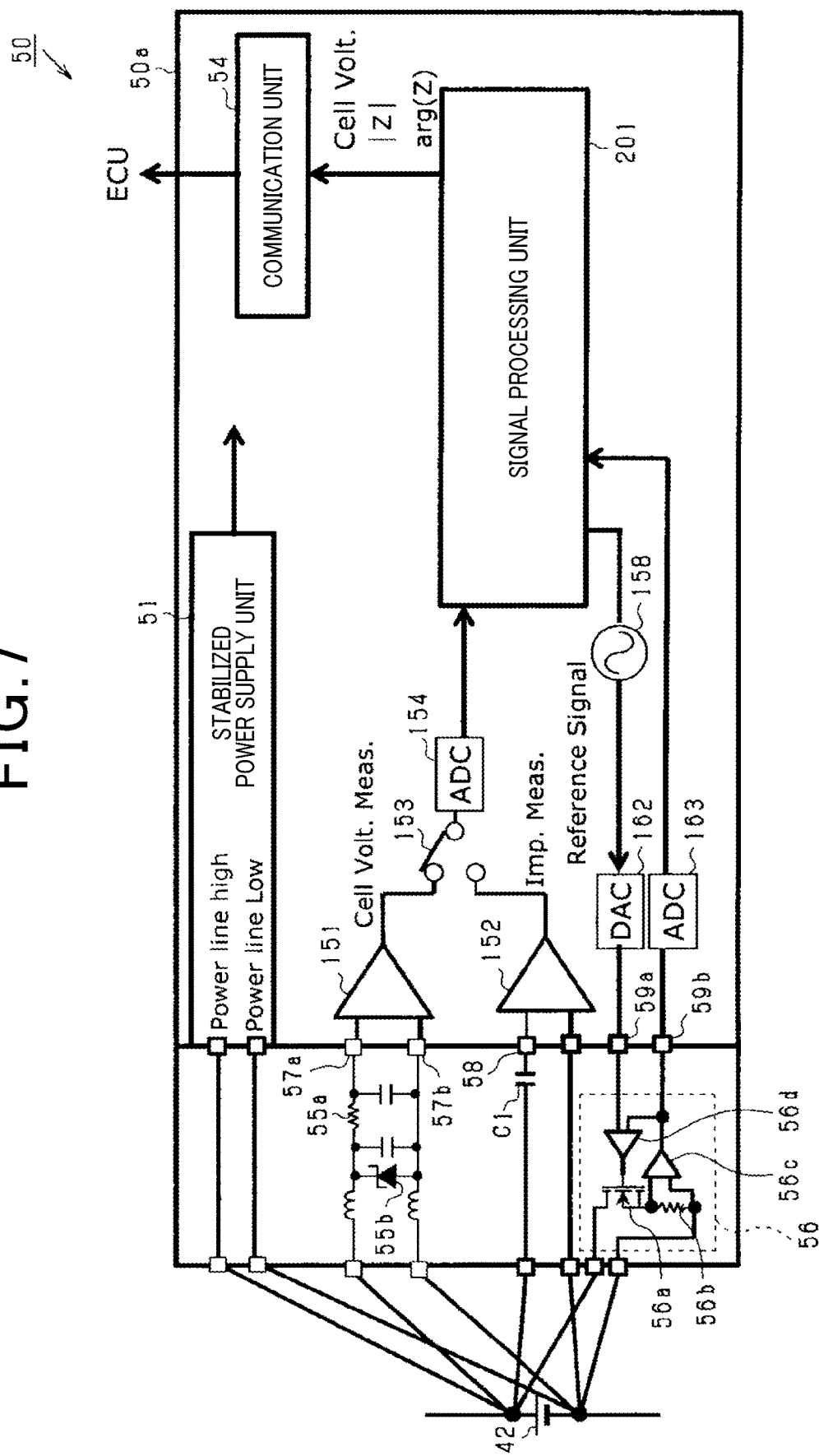
FIG. 7 is a schematic diagram of a battery monitoring device according to a third embodiment.

As illustrated in FIG. 7, the ASIC unit 50a of the battery monitoring device 50 includes a signal processing unit 201 as a calculation unit that performs a fast Fourier transform. The signal processing unit 201 is configured to receive a measured value of the DC voltage of the battery cell 42 via the AD converter 154. The signal processing unit 201 is also configured to receive the response signal via the AD converter 154. The signal processing unit 201 is also configured to receive the feedback signal via the AD converter 163. The signal processing unit 201 is connected to the oscillation circuit 158, and is configured to set the frequency of the sinusoidal signal.

The signal processing unit 201 is configured to performs a fast Fourier transform on each of the received response signal (voltage signal) and the received feedback signal (current signal). The signal processing unit 201 calculates the real part, the imaginary part, the absolute value, and the phase of the complex impedance based on the transformed values. Then, the signal processing unit 201 outputs a result of calculation to the ECU 60 via the communication unit 54.

Figure 8:
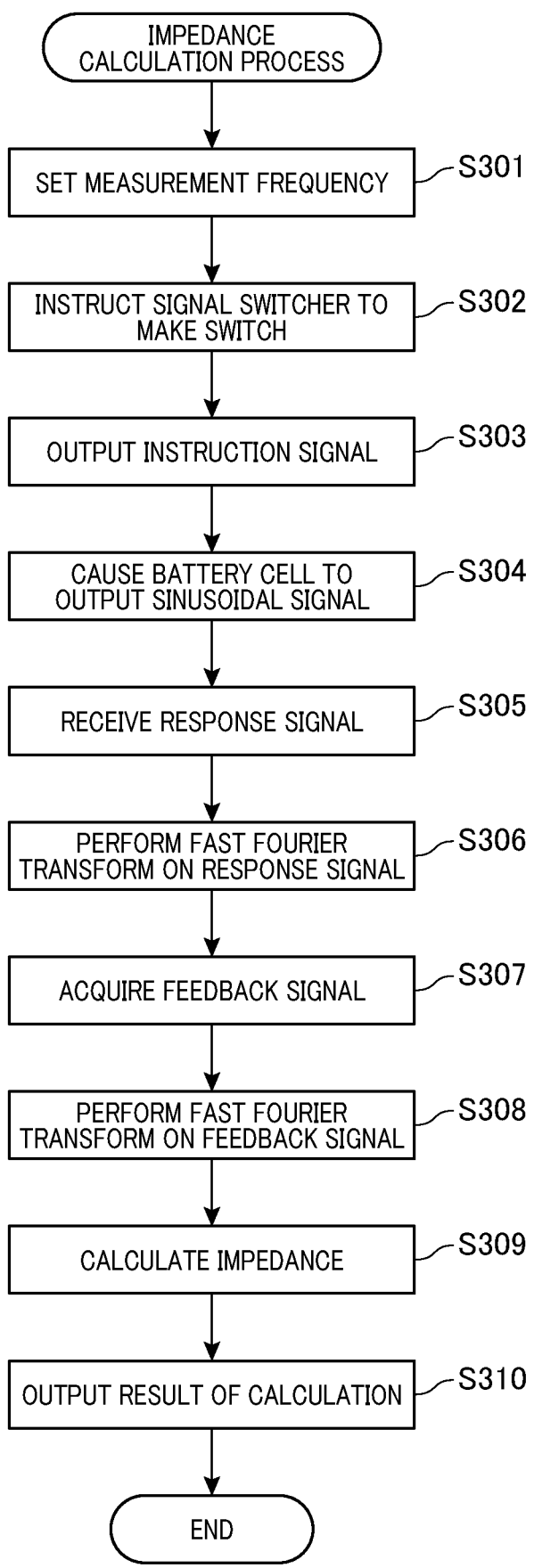
FIG. 8 is a flowchart of a complex impedance calculation process of the third embodiment.

The complex impedance calculation process in the third embodiment will now be described with reference to FIG. 8. The complex impedance calculation process is performed every predefined cycle by the battery monitoring device 50. In the complex impedance calculation process of the third embodiment, the process steps S301 to S305 are the same as the process steps S201 to S205 in the complex impedance calculation process of the second embodiment. The process steps of setting the measurement frequency, instructing the switch, instructing emission of the instruction signal, setting the offset value, and the like are performed, for example, by the signal processing unit 201.

The signal processing unit 201 performs a fast Fourier transform on the response signal received from the AD converter 154 (at step S306). This allows amplitude information of the response signal with respect to the measurement frequency to be acquired.

The signal processing unit 201 receives the feedback signal from the feedback signal input terminal 59b (at step S307). The feedback signal is converted into a digital signal by the AD converter 163 when it is input to the signal processing unit 155.

The signal processing unit 201 performs a fast Fourier transform on the feedback signal (at step S308). This allows amplitude information of the feedback signal for the measurement frequency to be acquired.

The signal processing unit 201 calculates all or some of the real part, the imaginary part, the absolute value, and the phase of the complex impedance based on the amplitude information of the response signal for the measurement frequency acquired at step S306 and the amplitude information of the feedback signal for the measurement frequency acquired at step S308 (at step S309). Thereafter, the signal processing unit 201 outputs a result of calculation to the ECU 60 via the communication unit 54 (at step S310). Then, the calculation process ends.

This calculation process is repeatedly performed until complex impedances for a plurality of frequencies within the measurement range are calculated. The ECU 60 may generate a complex impedance plane plot (Cole-Cole plot) based on the results of calculation to acquire characteristics of the electrodes and electrolytes and the like, for example, the state of charge (SOC) and the state of health (SOH).

The entire Cole-Cole plot does not necessarily have to be generated, and a portion thereof may be focused on. For example, the complex impedance for a specific frequency may be measured at certain time intervals during driving to acquire changes in the SOC, the SOH, the battery temperature, and the like during driving based on variations with time in the complex impedance for the specific frequency. Alternatively, the complex impedance for the specific frequency may be measured at time intervals, such as every day, every month, or every year, to acquire variations with time in the SOH and the like based on variations with time in the complex impedance for the specific frequency.

The battery monitoring device 50 of the third embodiment provides the following advantages.

Each of the response signal and the feedback signal is Fourier transformed to acquire the amplitude and phase information for the measurement frequency and the amplitude and phase information for the harmonics of the measurement frequency. Since the amplitude and phase information of the voltage and the current can be acquired for the measurement frequency and its harmonics, it is possible to calculate the complex impedance for multiple frequencies at once.

The signal processing unit 201 receives from the current modulation circuit 56 the feedback signal (detection signal) that is a current signal actually flowing from the battery cell 42, and performs a Fourier transform on the feedback signal. This allows the amplitude and phase deviations to be corrected. Therefore, the calculation accuracy of the complex impedance can be improved.

Other Embodiments (O1) In each of the above embodiments, the battery monitoring device 50 is provided for each battery cell 42, but the battery monitoring device 50 may be provided for a plurality of battery cells 42 (e.g., for each battery module 41 or for each assembled battery 40). In such an embodiment, some of the functions of the battery monitoring device 50 may be shared.

Figure 9:
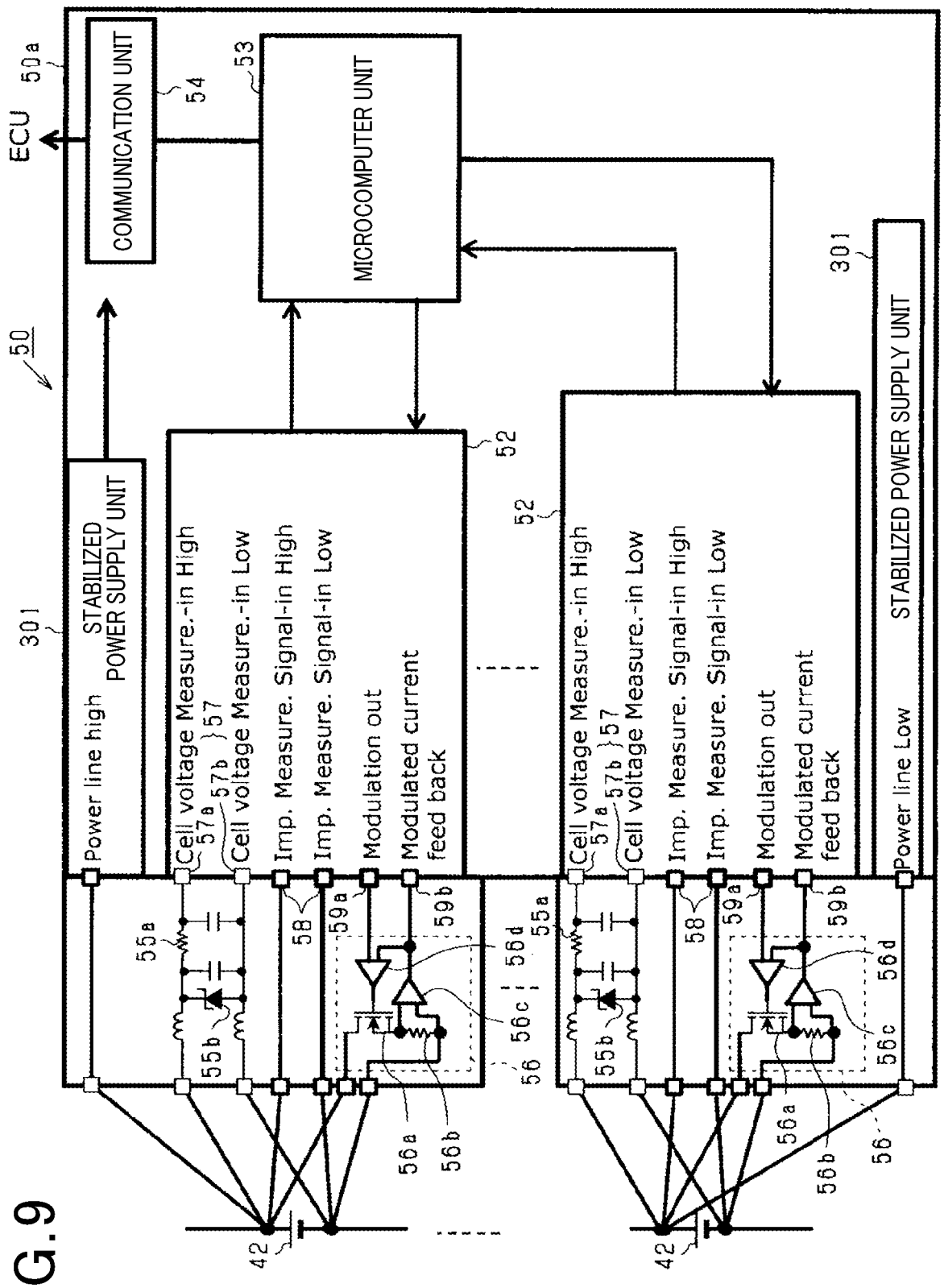
FIG. 9 is a schematic diagram of a battery monitoring device according to another embodiment.

For example, as illustrated in FIG. 9, the stabilized power supply unit 301, the communication unit 54, and the microcontroller unit 53 may be shared. In such an embodiment, the potential on the negative electrode may be different for each battery cell 42. Thus, the reference potential of each electrical signal used in transmitting information related to each battery cell 42 may be different. Therefore, it is necessary to provide a function for inputting each electrical signal to the microcomputer unit 53 for calculation, taking into account the differences in reference potential. As means for transmitting signals between different reference potentials, there are methods using capacitors, transformers, radio waves, and light.

Figure 10:
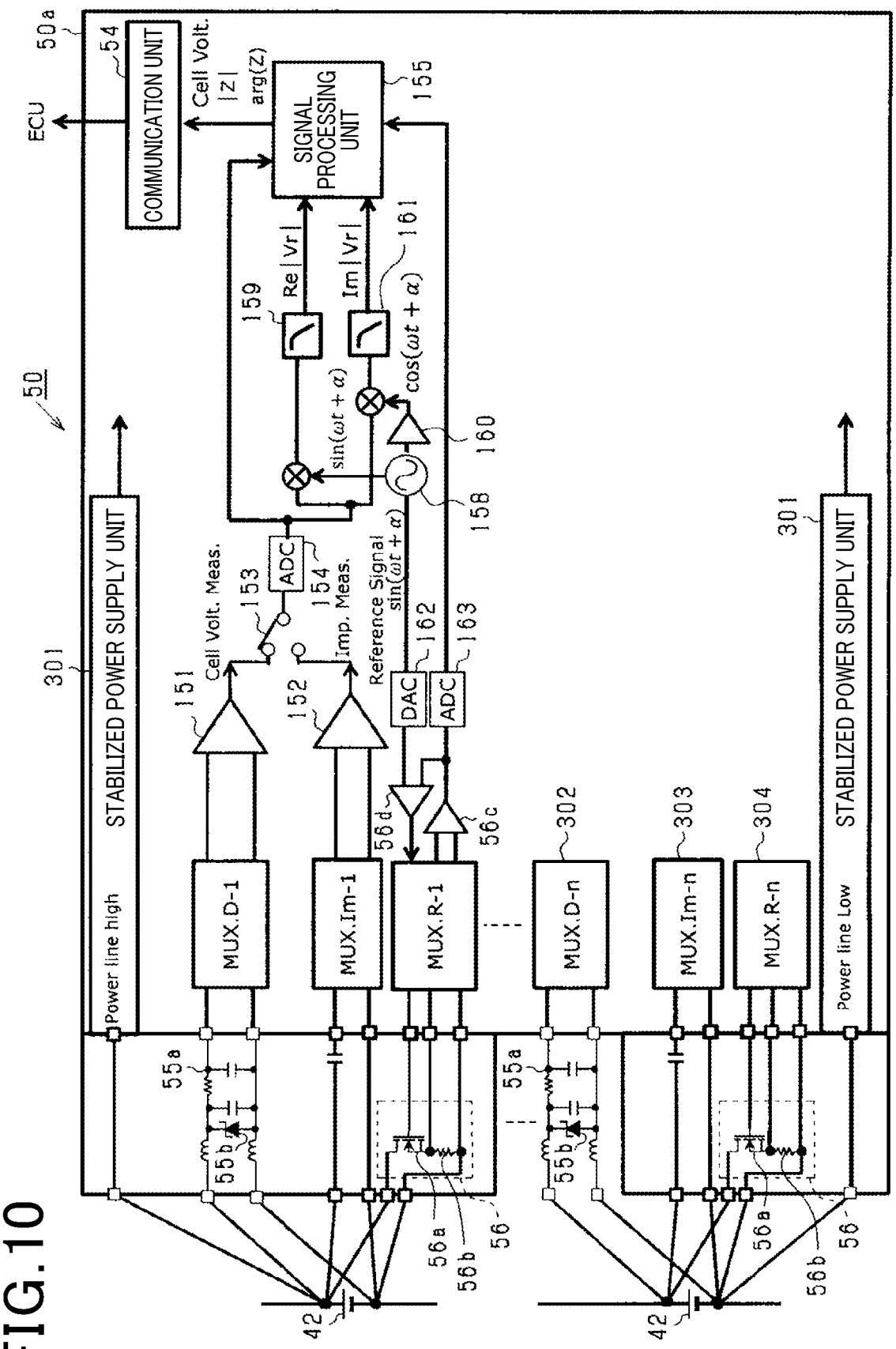
FIG. 10 is a schematic diagram of a battery monitoring device according to another embodiment.

For example, as illustrated in FIG. 10, the stabilized power supply unit 301, the communication unit 54, the differential amplifier 151, the pre-amplifier 152, the signal switcher 153, the AD converters 154, 163, the signal processing unit 155, the first multiplier 156, the second multiplier 157, the low pass filters 159, 161, the oscillation circuit 158, the phase shift circuit 160, the DA converter 162, the feedback circuit 56d, and the current detection amplifier 56c may be shared.

In such an embodiment, multiplexing devices, such as multiplexers 302 to 304, may be used to switch various signals, such as the DC voltage, the response signal, and the instruction signal.

Figure 11:
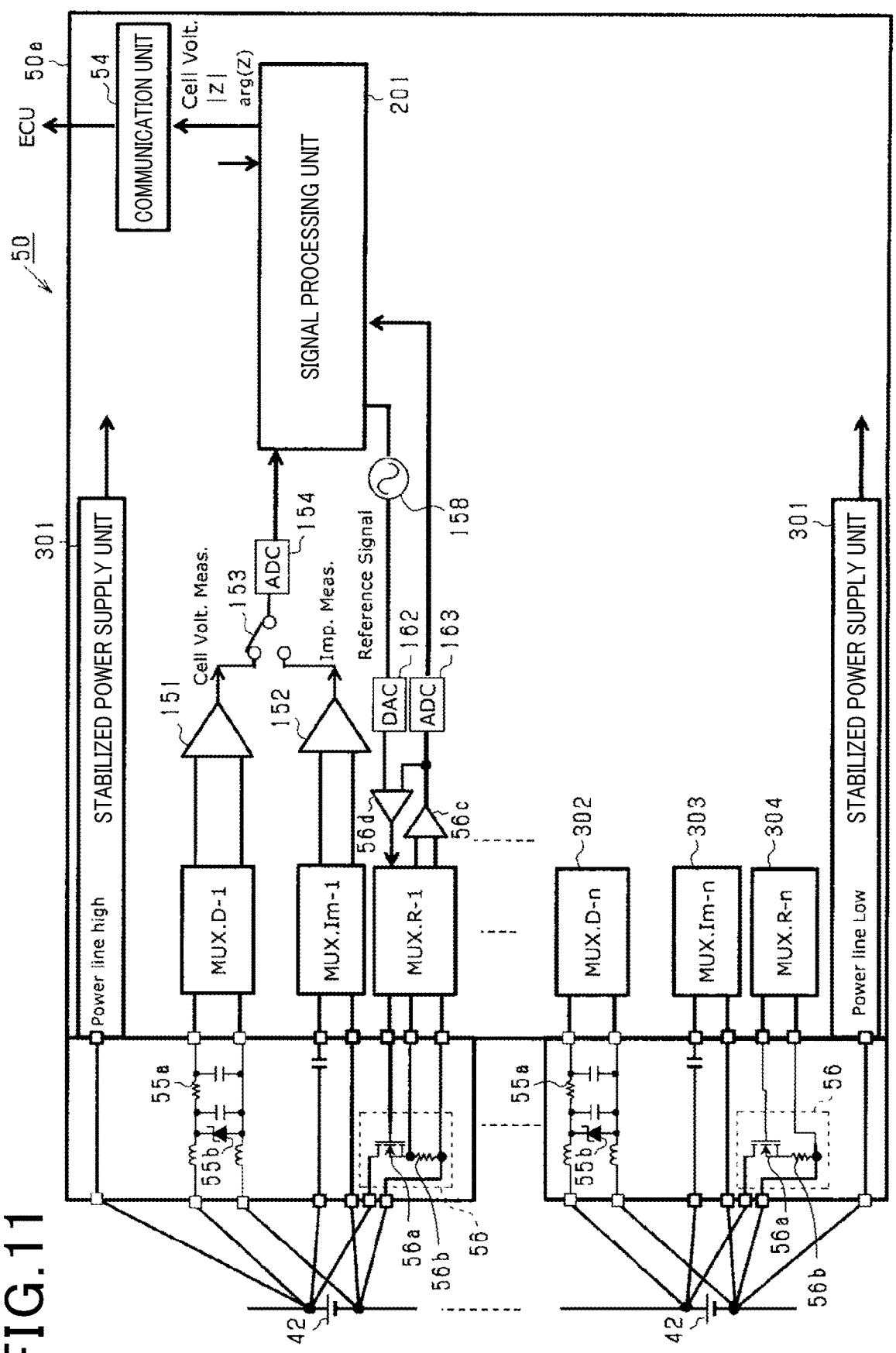
FIG. 11 is a schematic diagram of a battery monitoring device according to another embodiment.

Similarly, for example, as illustrated in FIG. 11, the stabilized power supply 301, the communication unit 54, the differential amplifier 151, the pre-amplifier 152, the signal switcher 153, the AD converters 154, 163, the signal processing unit 201, the oscillation circuit 158, the DA converter 162, the feedback circuit 56d, and the current detection amplifier 56c may be shared.

In such an embodiment, multiplexing devices, such as multiplexers 302 to 304, may be used to switch various signals, such as the DC voltage, the response signal, and the instruction signal.

Figure 12:
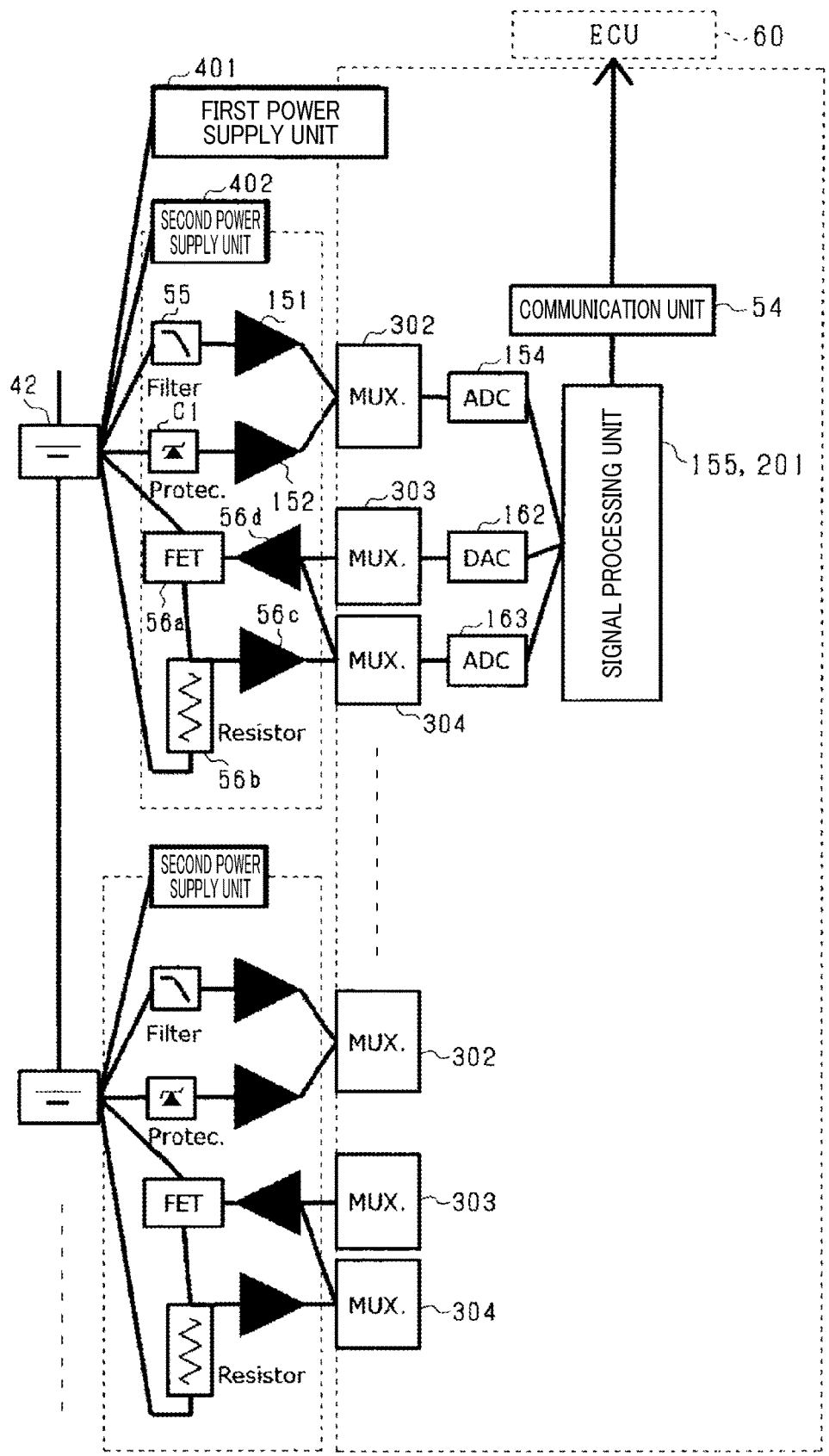
FIG. 12 is a schematic diagram of a battery monitoring device according to another embodiment.

Either one part in which the high potential side and the low potential side of the plurality of battery cells 42 connected in series are used as the positive and negative terminals, respectively, or another part, in which the high potential side and the low potential side of one battery cell 42 are used as the positive and negative terminals, respectively, may be shared. For example, as illustrated in FIG. 12, the communication unit 54, the AD converters 154, 163, the signal processing unit 155, 201, the oscillation circuit 158, the phase shift circuit 160, and the DA converter 162 may be shared. In FIG. 12, the first multiplier 156, the second multiplier 157, and the low-pass filters 159, 161 are omitted, but in an embodiment where the signal processing unit 155 that performs lock-in detection is employed, they may also be shared.

The shared part is supplied with electric power from the first power supply 401, and the first power supply 401 is supplied with electric power from the plurality of battery cells 42. Each non-shared part is supplied with electric power from the second power supply 402, and power is supplied to the second power supply 402 from a corresponding one of the plurality of battery cells 42. The output voltage of the first power supply 401 and the output voltage of the second power supply 402 are different.

In such an embodiment, multiplexing devices, such as multiplexers 302 to 304, may be used to switch various signals, such as the DC voltage, the response signal, and the instruction signal.

In the battery monitoring device 50 illustrated in each of FIGS. 9 to 11, a plurality of power sources may be provided in the same manner as in the battery monitoring device 50 illustrated in FIG. 12.

(O2) In each of the above embodiments, the battery monitoring device 50 may perform an equalization process to equalize the state of charge and the voltage of each battery cell 42. The equalization process is a process of discharging some of the battery cells 42 having a higher state of charge than other battery cells 42 so as to equalize the state of charge of each battery cell 42. With this configuration, the state of charge of each battery cell 42 can be equalized, and overcharging of some of the battery cells 42 can be inhibited. When the battery monitoring device 50 performs the equalization process, the battery cells 42 may be discharged by using the current modulation circuit 56, where the battery monitoring device 50 serves as a discharge control unit.

Specifically, in the first embodiment, upon receiving a discharge instruction from the ECU 60 or the like based on the state of charge or the voltage of each battery cell 42 or in response to the state of charge or the voltage of each battery cell 42 exceeding a predefined value, the microcomputer unit 53 outputs the instruction signal to the current modulation circuit 56 to cause the battery cell 42 to output a periodic function such as a sinusoidal wave signal or a rectangular wave, or a direct current signal. The microcomputer unit 53 continues outputting the instruction signal until the discharge instruction ends or until the state of charge or the voltage of the battery cell 42 becomes less than the predefined value. In this way, the equalization process is carried out. Similarly in the second or third embodiment, the signal processing unit 155, 201 may perform the equalization process. Also, in the battery monitoring device 50 illustrated in FIGS. 9 to 12, the equalization processing may be similarly performed.

Then, when discharging from the battery cell 42 for the equalization process, the sinusoidal signal may be output and the complex impedance may thereby be calculated. This allows the power consumption to be suppressed. The current to be output for the equalization process is typically considered to be a weak current in order to suppress power consumption and to reduce the size of the device. Therefore, it is preferable to have the equalization process performed by the battery monitoring device 50 which can accurately calculate the complex impedance by lock-in detection even with a weak current as in the second embodiment.

(O3) In each of the above embodiments, the filter unit 55 may not be formed solely of an element. For example, it may be configured by wiring, a connector contact part, a pattern wiring of a printed circuit board or between solid patterns, or by a mixture of these configurations and elements.

(O4) In each of the above embodiments, a filter circuit may be provided between the current modulation circuit 56 and the input and output unit 52 (or the DA converter 162). This can suppress errors that may occur during conversion of the instruction signal to an analog signal.

(O5) In each of the above embodiments, all or some of the differential amplifier 151, the pre-amplifier 152, the signal switcher 153, the AD converters 154, 163, the signal processing unit 155, the first multiplier 156, the second multiplier 157, the low pass filters 159, 161, the oscillation circuit 158, the phase shift circuit 160, the DA converter 162, the feedback circuit 56d, and the current detection amplifier 56c may be implemented by software.

(O6) In each of the second and third embodiments above, there may be no capacitor C1.

(O7) In each of the above embodiments, there may be no feedback circuit 56d. The current flowing through the resistor 56b may not be detected by the current detection amplifier 56c. The microcomputer unit 53 and the signal processing units 155, 201 may not need to receive the feedback signal.

(O8) In each of the above embodiments, the DC voltage is detected. In alternative embodiment, the DC voltage does not have to be detected.

(O9) In the above second or third embodiment, the signal switcher 153 may not be provided.

(O10) In the above second or third embodiment, the feedback signal may also be switched by the signal switcher 153. The AD converters 154 and 163 may thereby be shared.

(O11) The battery monitoring device 50 of each of the above embodiments may be employed in a hybrid electric vehicle (HEV), an electric vehicle (EV), a plug-in hybrid vehicle (PHV), an auxiliary battery, an electric airplane, an electric motorcycle, or an electric ship as a vehicle.

(O12) In each of the above embodiments, the battery cells 42 may be connected in parallel.

(O13) In the above second or third embodiment, a filter circuit may be provided before or after the pre-amplifier 152 or immediately before the AD converter 154 in order to prevent aliasing during AD conversion.

(O14) In each of the above embodiments, the state may be monitored for each battery module 41. In such an embodiment that the communication unit 54 is provided for each battery module 41, communication from each communication unit 54 to the ECU 60 may be isolated communication with a different voltage potential reference. For example, the isolated communication may be performed using an isolation transformer or a capacitor.

Figure 13:
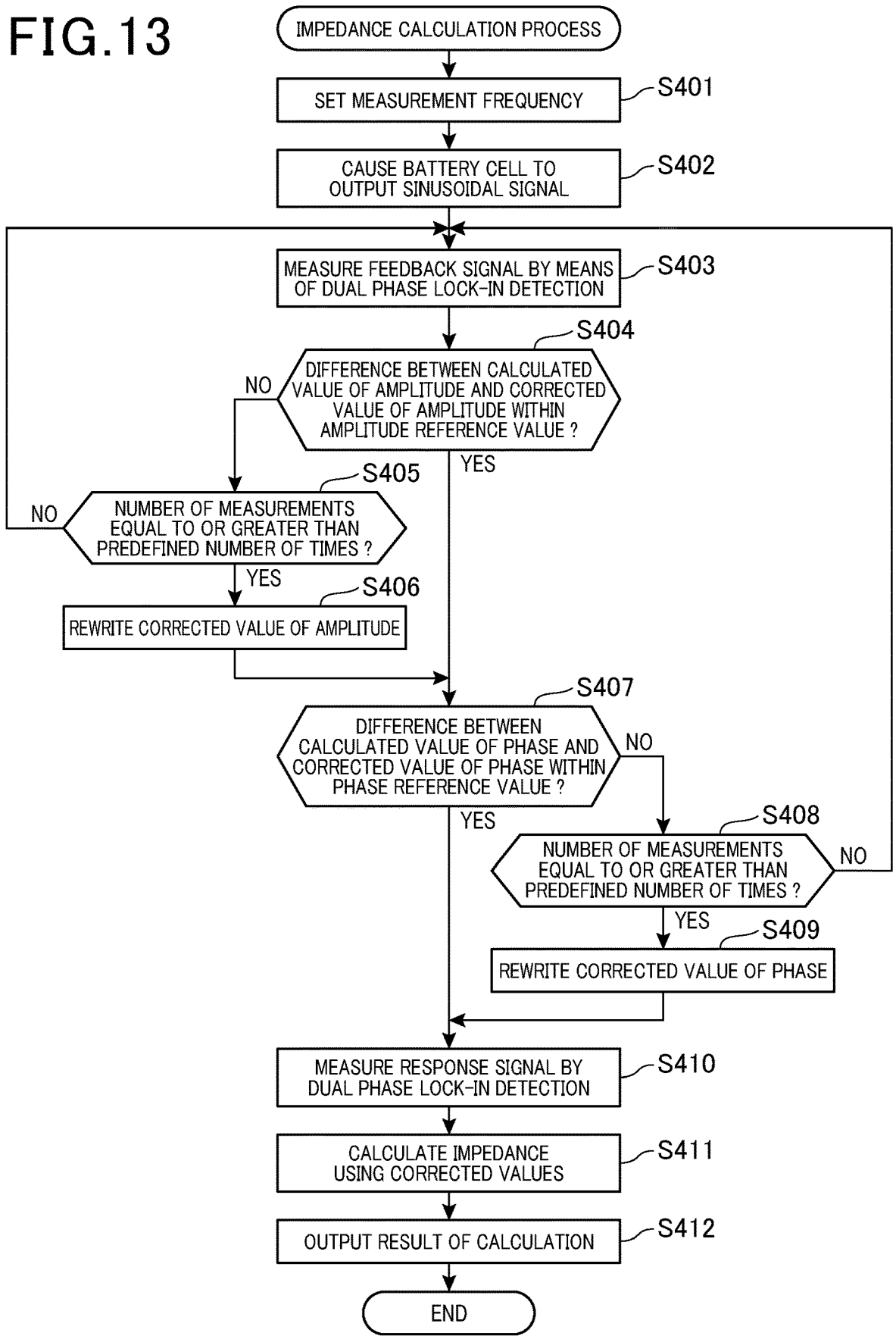
FIG. 13 is a flowchart of a complex impedance calculation process of another embodiment.

(O15) In each of the above embodiments, the feedback signal may be a lock-in detection. Specifically, as illustrated in FIG. 13, the complex impedance calculation process is performed by the battery monitoring device 50 every predefined cycle.

In the complex impedance calculation process, the oscillation circuit 158 first sets a measurement frequency for the complex impedance (at step S401). The measurement frequency is set to a frequency within a predefined measurement range. In another example, the measurement frequency is determined, for example, by the signal processing unit 155.

The oscillation circuit 158 determines the frequency of the sinusoidal signal (predefined AC signal) based on the measurement frequency, and outputs the instruction signal from the instruction signal output terminal 59a to the current modulation circuit 56 via the DA converter 162 to instruct emission of the sinusoidal signal (at step S402). Based on the instruction signal, the current modulation circuit 56 causes the battery cell 42 to output the sinusoidal signal as a power source. Thus, the sinusoidal wave signal is output from the battery cell 42.

Then, the signal processing unit 155 measures the feedback signal by means of dual phase lock-in detection (at step S403). Specifically, the signal processing unit 155 multiplies the sinusoidal signal (reference signal) instructed by the oscillation circuit 158 and the received feedback signal. The signal processing unit 155 multiplies the sinusoidal signal instructed by the oscillation circuit 158 shifted in phase by 90 degrees and the received feedback signal. The signal processing unit 155 calculates the amplitude and the phase of the feedback signal from these multiplication results.

The signal processing unit 155 then determines whether a difference between the calculated value of amplitude and a corrected value of amplitude is within a reference value of amplitude (at step S404). The corrected value of amplitude refers to an amplitude of the sinusoidal signal that is expected to be output.

If the answer is NO, the signal processing unit 155 determines whether the number of measurements (the number of measurements of the feedback signal) by the step S403 is equal to or greater than a predefined number of times (at step S405). If the answer is NO, the signal processing unit 155 increments the number of measurements by one and returns to step S403.

If the answer is YES at step S405, the signal processing unit 155 calculates an average of the measured amplitudes of the feedback signals and rewrites the corrected value of amplitude to the average of the measured amplitudes (step S406). Thereafter, the number of measurements is cleared.

If the answer is YES at step S404, or after completion of step S406, the signal processing unit 155 determines whether a difference between the value of phase calculated at step S403 and the corrected value of phase is within a reference value of phase (at step S407). The corrected value of phase refers to a phase of the sinusoidal signal that is expected to be output.

If the answer is NO at step S407, the signal processing unit 155 determines whether the number of measurements (the number of measurements of the feedback signal) by step S403 is equal to or greater than a predefined number of times (at step S408). If the answer is NO, the signal processing unit 155 increments the number of measurements by one and returns to step S403.

If the answer is YES at step S408, the signal processing unit 155 calculates an average of the measured phases of the feedback signals and rewrites the corrected value of phase to the average of the measured phases (step S409). Thereafter, the number of measurements is cleared.

Subsequently, the signal processing unit 155 measures the response signal by dual phase lock-in detection (at step S410). This process step is the same as steps S202, S205, S206 of the second embodiment, so the description is omitted.

The signal processing unit 155 calculates all or some of the real part, the imaginary part, the absolute value, and the phase of the complex impedance based on the feedback signal and the signals (values proportional to the real part and the imaginary part) received from the low-pass filters 159 and 161 (at step S411). The feedback signal is determined by the corrected value of amplitude and the corrected value of phase, and is used to correct for the amplitude or phase deviation between the current actually flowing from the battery cell 42 (i.e., the feedback signal) and the value proportional to the reference signal.

Thereafter, the signal processing unit 155 outputs the result of calculation to the ECU 60 via the communication unit 54 (at step S412). Then, the complex impedance calculation process ends.

As described above, since the feedback signal is measured by the dual phase lock-in detection, the current signal actually output from the battery cell 42 can be measured accurately even in a noisy environment. In addition, since this feedback signal is used for correction when calculating the complex impedance, the calculation accuracy of the complex impedance can be improved.

(O16) In each of the above embodiments, the current signal to be output from the battery cell 42 is not limited to a sinusoidal wave signal. For example, as long as it is an AC signal, it can be a square wave, a triangular wave, or the like.

(O17) In each of the above embodiments, the ECU 60 may include a plurality of ECUs. For example, a plurality of ECUs may be provided for respective functions, or a plurality of ECUs may be provided for respective components to be controlled. For example, the plurality of ECUs may include a battery ECU and an inverter control ECU.

(O18) In each of the above embodiments, when lock-in detection is performed, the sinusoidal signal instructed by the oscillation circuit 158 is used as the reference signal (first reference signal). In an alternative embodiment, the detection signal (feedback signal) may be used as the reference signal. When dual phase lock-in detection is performed, the detection signal (feedback signal) shifted in phase may be the second reference signal.

(O19) In each of the above embodiments, the battery cell 42 (the battery module 41, the assembled battery 40) may be used as a power source for peripheral circuits while outputting the sinusoidal wave signal based on the instruction (while the response signal is being output). Conversely, the battery cell 42 (the battery module 41, the assembled battery 40) may not be configured to be used as a power source for peripheral circuits when outputting the sinusoidal wave signal based on the instruction (while the response signal is being output).

While the disclosure has been described in accordance with the embodiments, it is understood that the disclosure is not limited to such embodiments or structures. The disclosure also encompasses various modifications and variations within the scope of equivalence. Furthermore, various combinations and modes, as well as other combinations and modes including only one element, more or less, thereof, are also within the scope and idea of the disclosure.

What is claimed is:

1. A battery monitoring device for monitoring a state of a rechargeable battery that includes an electrolyte and a plurality of electrodes, comprising:
   a signal control unit configured to instruct emission of a predefined AC signal;
   a response signal input unit configured to receive a response signal of the rechargeable battery to the AC signal;
   a calculation unit configured to calculate a complex impedance of the rechargeable battery based on the response signal; and
   a power supply unit configured to receive a power supply voltage from the rechargeable battery and supplies the power supply voltage to at least the calculation unit; and
   a waveform instruction unit configured to output an instruction signal to indicate a waveform of the AC signal to the signal control unit,
   wherein a first electrical path connecting the rechargeable battery to the power supply unit and a second electrical path connecting the rechargeable battery to the signal control unit are provided independent of each other,
   the signal control unit is configured to cause the rechargeable battery to be monitored, as a power source, to output the predefined AC signal,
   the signal control unit includes a switching unit configured to adjust an amount of current based on an instruction, a resistor connected in series with the switching unit, a current detection unit configured to detect a current flowing through the resistor, and an instruction unit configured to provide the instruction to the switching unit, the instruction unit being configured to provide the instruction to the switching unit so as to make a correction for errors in a detection signal detected by the current detection unit based on a comparison between the detection signal and the instruction signal, the calculation unit is configured to perform dual phase lock-in detection to determine an amplitude and a phase of the detection signal based on a value calculated by multiplying the instruction signal indicated by the waveform instruction unit and the detection signal from the current detection unit, and a value calculated by multiplying a signal acquired by shifting a phase of the instruction signal by a predefined angle and the detection signal, and the calculation unit is configured to calculate the complex impedance based on the response signal and a detection signal detected by the dual phase lock-in detection.

2. The battery monitoring device according to claim 1, wherein a third electrical path connecting the rechargeable battery to the response signal input unit, through which the response signal flows, is provided independent of the first electrical path connecting the rechargeable battery to the power supply unit and the second electrical path connecting the rechargeable battery to the signal control unit.

3. The battery monitoring device according to claim 1, wherein the response signal input unit is connected to connectable points on terminals of the rechargeable battery, closest to respective electrodes of the rechargeable battery.

4. The battery monitoring device according to claim 1, wherein the rechargeable battery comprises a plurality of rechargeable battery cells, the battery monitoring device further comprises a discharge control unit configured to acquire the state of each of the plurality of rechargeable battery cells and discharge the rechargeable battery cells such that the states of the respective rechargeable battery cells are equalized, the discharge control unit being configured to instruct to the signal control unit discharge from the rechargeable battery cells.

5. The battery monitoring device according claim 4, wherein the calculation unit is configured to calculate the complex impedance while the discharge control unit is instructing the discharge.

6. The battery monitoring device according to claim 1, wherein the calculation unit is configured to calculate a real part of the response signal received from the response signal input unit based on a value acquired by multiplying the response signal and a first reference signal which is the AC signal instructed by the waveform instruction unit, and calculate an imaginary part of the response signal received from the response signal input unit based on a value acquired by multiplying the response signal and a second reference signal which is the AC signal instructed by the waveform instruction unit, shifted in phase.

7. The battery monitoring device according to claim 1, wherein the calculation unit is configured to perform a Fourier transform on each of the response signal and the AC signal to calculate the complex impedance.

8. The battery monitoring device according to claim 1, wherein the calculation unit is configured to perform a Fourier transform on each of the response signal and the detection signal detected by the current detection unit to calculate the complex impedance.

9. The battery monitoring device according to claim 1, wherein the response signal input unit is configured to receive variations in voltage of the rechargeable battery through a capacitor and has one or more stages of amplifiers, and amplify the received variations in voltage of the rechargeable battery via the amplifiers and outputs a result of amplification as the response signal.

10. The battery monitoring device according to claim 1, wherein at least one of a filter circuit and a protection element is connected to the rechargeable battery.

11. The battery monitoring device according to claim 1, wherein the rechargeable battery comprises a plurality of rechargeable battery cells, and the state of each of the plurality of rechargeable battery cells is monitored using the calculation unit.

* * * * *